(12) United States Patent
Nanda et al.

(10) Patent No.: US 6,469,650 B2
(45) Date of Patent: Oct. 22, 2002

(54) METHOD AND SYSTEM FOR SELECTING IMPLEMENTATION OF A FILTER CONTROLLER BETWEEN A SINGLE CONVERSION MODE THAT ENSURES A FULLY-SETTLED CONVERTED OUTPUT AND A CONTINUOUS CONVERSION MODE

(75) Inventors: Kartik Nanda, Nashua, NH (US); Aryesh Amar, Nashua, NH (US); Saibun Wong, Nashua, NH (US); Jerome E. Johnston, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/800,604

(22) Filed: Mar. 6, 2001

(65) Prior Publication Data

US 2002/0126032 A1 Sep. 12, 2002

(51) Int. Cl.[7] .................................................. H03M 1/12
(52) U.S. Cl. ........................ 341/155; 341/118; 341/120; 341/143; 341/157
(58) Field of Search .................................. 341/155, 157, 341/143, 118, 120

(56) References Cited

U.S. PATENT DOCUMENTS 5,886,658 A * 3/1999 Amar et al. ................. 341/155

* cited by examiner

Primary Examiner—Michael Tokar
Assistant Examiner—Linh Van Nguyen
(74) Attorney, Agent, or Firm—Steven Lin, Esq.

(57) ABSTRACT

A method and system for selecting implementation of a filter controller between a single conversion that ensures a fully-settled converted output and a continuous conversion of an input signal are disclosed. State machine determines whether convert start signal has a duration, which ends on or before a first occurrence of a conversion done on the input signal. Conversion done is an occurrence of when a bit set has been converted from the input signal. If convert start signal has a duration which ends on or before the first occurrence of conversion done, then state machine selects and implements single conversion of the input signal. Digital system ensures a fully-settled converted output by waiting for the filter to receive and filter a predetermined number of bit sets for a conversion output and then outputting the conversion output. Otherwise, state machine selects and implements continuous conversion of the input signal.

26 Claims, 4 Drawing Sheets

METHOD AND SYSTEM FOR SELECTING IMPLEMENTATION OF A FILTER CONTROLLER BETWEEN A SINGLE CONVERSION MODE THAT ENSURES A FULLY-SETTLED CONVERTED OUTPUT AND A CONTINUOUS CONVERSION MODE

BACKGROUND OF THE INVENTION

1. Technical Field

The present invention relates in general to an analog-to-digital converter, and, in particular, to a filter controller for an analog-to-digital ("A/D") converter. Still more particularly, the present invention relates to a method and system for selecting implementation of a filter controller for an analog-to-digital converter between a single conversion mode that ensures a fully-settled converted output and a continuous conversion mode.

2. Description of the Related Art

Analog-to-digital converters ("ADCs") are used to convert an analog signal to a digital signal for digital processing and/or storage. ADCs are well known in the art and are used in a variety of applications. An ADC generally has an analog system and a digital system coupled to each other. The analog system includes at least a modulator for modulating the input analog signal. The analog system processes and converts an analog input signal to a digital output signal. The digital system processes and outputs the digital signal. The digital system has at least a filter. The filter operates to remove and/or reduce unwanted parts of the digital signal. The filter also extracts the important information by using digital signal processing ("DSP") techniques. The filter may further control the mode in which the digitized bit stream from the analog system is to be converted. Two exemplary modes of conversion performed on a signal are the single conversion mode and the continuous conversion mode.

Applications of the ADC that take only a single sample or reading (e.g., single temperature or weight reading) would require the ADC to operate in the single conversion mode. In the single conversion mode, the analog system digitizes an input signal and continuously outputs digitized bits of data as a bit stream. The filter then receives the bit stream from the analog system. The filter then filters only a single set of bits from the bit stream and converts the single set of bit along with a remaining number of bit sets, which may have non-updated values or initial zero values, into a conversion word. A predetermined number of bit sets are required for an accurate (or fully-settled) conversion word. However, only a single bit set has been converted, resulting in an inaccurate conversion word. A latency associated with the conversion therefore exists. In the single conversion mode, the filter disregards latter bit sets provided by the analog system after the filter outputs the conversion word. Furthermore, applications of the ADC that take only continuous samples or readings (e.g., continuous monitoring of temperature or weight readings) would require the ADC to operate in the continuous conversion mode. In the continuous conversion mode, the analog system also digitizes an input signal and continuously outputs digitized bits of data as a bit stream. The filter then receives the bit sets, filters, and converts the bit sets and then outputs the conversion word continuously. In the continuous conversion mode, the ADC continuously outputs conversion words so long as the filter receives bit sets to convert into conversion words.

Signals that are input into and flowing through an ADC for processing may take time to settle in the ADC circuitry. In other words, latency associated with conversions may exist. One problem that currently exists with the single conversion mode is that the conversion word outputted by the filter does not represent a fully-settled conversion word due to the latency associated with the filter. This problem of a non-fully-settled conversion word occurs when a conversion word is output by the filter before all the required sets of bits for a fully-settled conversion output have been sampled and provided by the analog system. The accuracy and performance of the ADC is significantly affected when the ADC is operating in the single conversion mode and the filter does not take the various bit sets needed for a fully-settled conversion word.

Another problem exists with the ADC chip in that typically an extra pin, such as a conversion mode pin, needs to be made part of the chip in order to switch between operating the ADC in the single conversion mode and the continuous conversion mode. For example, if the conversion mode pin is set high or to a one value, then the ADC chip operates in the continuous conversion mode. Alternatively, if the conversion mode pin is set low or to a zero value, then the ADC chip operates in the single conversion mode. The addition of an extra pin on the ADC circuit adds to the size and cost of the ADC chip.

The present invention recognizes the need for an ADC when operating in the single conversion mode that ensures a fully-settled converted output. Furthermore, the present invention recognizes the need to enable switching between the single conversion mode and the continuous conversion mode but at the same time recognizes the need to reduce pins on an ADC circuitry, which minimizes or reduces cost of the overall ADC chip. The present invention overcomes the problems and disadvantages in accordance with the prior art.

SUMMARY OF THE INVENTION

A method and system for selecting implementation of a filter controller between a single conversion that ensures a fully-settled converted output and a continuous conversion of an input signal are disclosed. The filter controller controls a filter in a digital system of an analog-to-digital converter. The filter controller has a state machine for implementing the selection. The state machine detects a convert start signal, which signifies a start of a conversion process. The state machine determines whether the convert start signal has a duration, which ends on or before a first occurrence of a conversion done on the input signal. The conversion done is an occurrence of when a bit set has been converted from the input signal. If the convert start signal has a duration which ends on or before the first occurrence of the conversion done, then the state machine selects and implements the single conversion of the input signal. The digital system ensures a fully-settled converted output by waiting for the filter to receive and filter a predetermined number of bit sets for a conversion output and then outputting the conversion output. Otherwise, the state machine selects and implements the continuous conversion of the input signal.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

The present invention discloses a method and system for selecting implementation of a filter controller between a single conversion that ensures a fully-settled converted output and a continuous conversion of an input signal.

Figure 1:
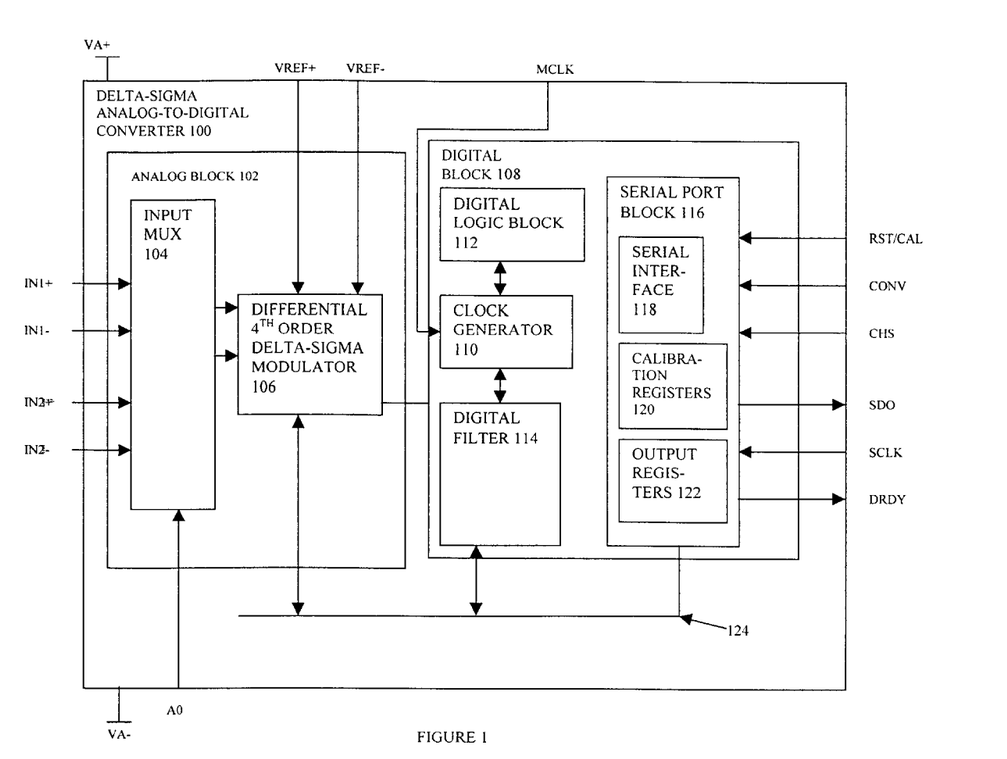
FIG. 1 is a block diagram of an exemplary delta-sigma analog-to-digital converter ("ADC"), which implements the present invention.

With reference now to FIG. 1, a block diagram of an exemplary delta-sigma analog-to-digital converter ("ADC") 100, which implements the present invention, is shown. ADC 100 has an analog block 102 and a digital block 108. ADC 100 is driven by a power supply with power supply voltages VA− and VA+. Analog block 102 includes at least an input multiplexer ("MUX") 104 and a differential fourth ($4^{th}$) order delta-sigma modulator ("delta-sigma modulator") 106, which are coupled together in series as shown in FIG. 1. Input MUX 104 receives two sets of inputs that may be converted from analog signals to digital signals for two respective input channels of ADC 100. One set of input signals includes IN1+ and IN1− signals. The other set of input signals includes IN2+ and IN2− signals. Input MUX 104 also has a channel select pin A0 coupled to the switching components of input MUX 104. Channel select pin A0 allows control in selecting between processing either the one or the other set of input signals. For example, ADC 100 may be set up so that if channel select pin A0 is set to a zero or low value, then IN1+ and IN1− signals are selected for conversion and processing. Alternatively, if channel select pin A0 is set to a one or high value, then IN2+ and IN2− signals are selected for conversion and processing.

For proper operation, delta-sigma modulator 106 is coupled to reference voltages VREF+ and VREF−. Delta-sigma modulator 106 generally transforms an input signal, which is limited in frequency band, into a one-bit digital output signal. Delta-sigma modulator 106 generally modulates the pulse density of the output signal based on the input signal. Delta-sigma modulator 106 is coupled to a serial port block 116 via a serial interface bus 124. As is well known in the art, delta-sigma modulator 106 typically includes at least integrating circuits, summation circuits, and a quantizer for modulating the output signal based on the input signal.

Digital block 108 has at least a clock generator 110, a digital logic block 112, and a digital filter 114 coupled together as shown in FIG. 1. Clock generator 110 generates the internal clock for proper operations of ADC 100. A master clock ("MCLK") pin is coupled to clock generator 110. Digital logic block 112 contains circuitry for digitally processing the signals from analog block 102. Digital filter 114 is coupled to serial port block 116 through serial interface bus 124. Serial port block 116 allows ADC 100 to serially interface its output to another device. Serial port block 116 also includes a serial interface 118, calibration registers 120, and output registers 122. Various ADC chip pins are coupled to serial port block 116. The other ADC chip pins that are shown in FIG. 1 are: a reset and calibration ("RST/CAL") pin used for resetting serial port block 116 and digital filter 114 and performing an automatic calibration, a convert start ("CONV") pin used for signifying the start of converting an analog input signal into a digital output signal, a chip select ("CHS") pin used for selecting use of ADC 100 when a defined value is inputted at the CHS pin, a serial data output ("SDO") pin used for reading the converted data output from ADC 100, a serial interface clock ("SCLK") pin used for inputting a serial interface clock signal into digital block 108 of ADC 100 to control reading of data from serial port block 116, and a data ready ("DRDY") pin used to convey to the user when data is available to be read.

Digital filter 114 operates to remove and/or reduce unwanted parts of the signal. Digital filter 114 also extracts the important information by using digital signal processing ("DSP") techniques. Digital filter 114 may further control the mode in which input signals are to be converted. Two exemplary modes of conversion performed on a signal are the single conversion mode and the continuous conversion mode, which were discussed in detail earlier in the description of the related art section.

Figure 2:
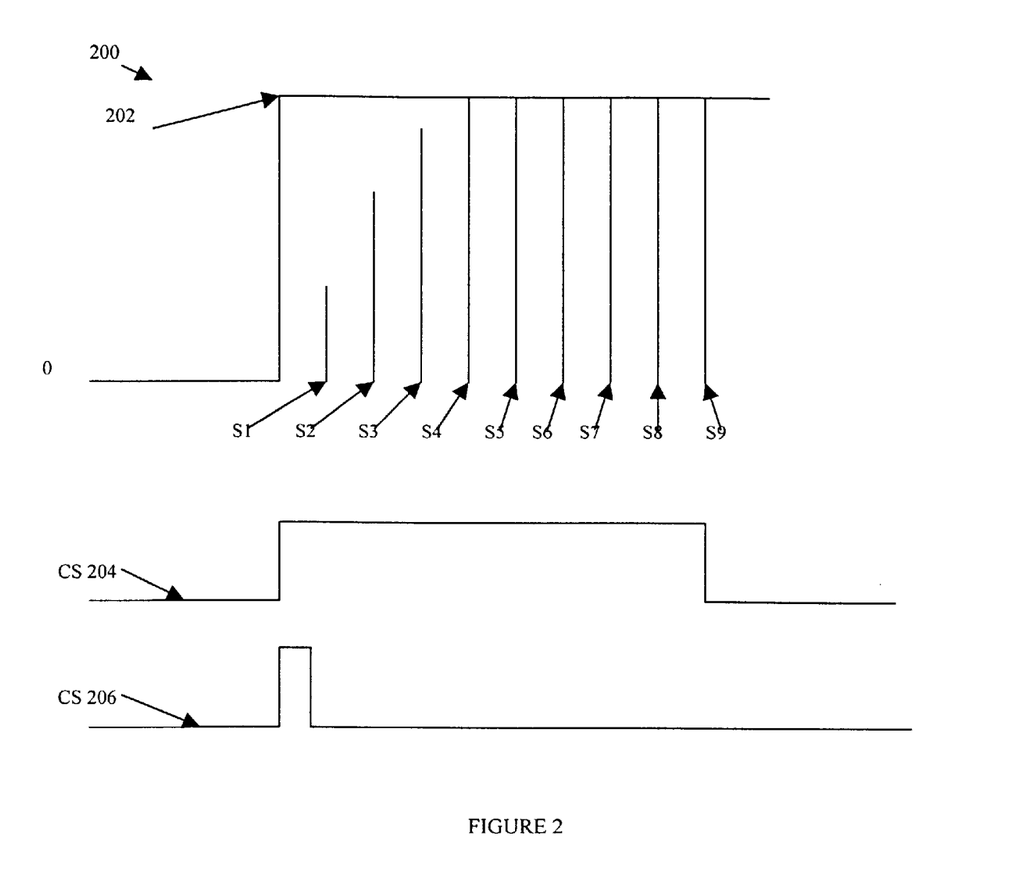
FIG. 2 is a graphical diagram of exemplary bit sets digitized from an ADC input signal shown in timing relationship with an exemplary convert start signal for the continuous conversion mode and an exemplary convert start signal for the single conversion mode.

Referring now to FIG. 2, a graphical diagram 200 of exemplary bit sets S1 to S9 from a bit stream that was digitized from an ADC input signal (e.g., IN1+ and IN1− signals or IN2+ and IN2− signals) by analog block 102 is shown. Input waveform 202 is an exemplary portion of the input signal of ADC 100, and bit sets S1 to S9 are digitized from input waveform 202. Exemplary bit sets S1 to S9 are shown in timing relationship with an exemplary convert start ("CS") signal 204 for the continuous conversion mode and an exemplary convert start ("CS") signal 206 for the single conversion mode. Each bit set S1 to S9 is generated by using a fixed or predetermined number of sample bits taken from the bit stream (e.g., 96 sample bits taken from the bit stream for each bit set) generated by analog block 102 from the input signal. ADC 100 processes the input signal in the continuous conversion mode if CS signal 204 is input into CONV pin of ADC 100. CS signal 204 has a one or high value for a duration from bit set S1 to bit set S8 (e.g., has a one or high value after bit set S1). Digital block 108 continuously outputs a conversion word(s) based on converted bit sets S1 to S8 and on CS signal 204 having a one or high value. Furthermore, ADC 100 processes the input signal in the single conversion mode if CS signal 206 is instead input into CONV pin of ADC 100. CS 206 has a one or high value which has a duration that lasts until or before bit set S1. For example, if CS signal 206 has a one or high value until or before the first occurrence of a converted sample data set (e.g., until or before sample data set S1) and each conversion word requires four bit sets, then digital block 108 waits and outputs a conversion word based on bit sets S1 to S4.

Signals that are input into and flowing through ADC 100 for processing may take time to settle in the ADC circuitry. As shown in FIG. 2, exemplary bit sets S1, S2, S3, and S4 are needed to provide a fully-settled conversion word in the present example. One of the problems of operating ADC 100 in the single conversion mode is that a fully-settled conversion word is not outputted if the first bit set S1 is the only bit set converted and outputted for the conversion word.

The other three bit sets S2, S3, and S4 have not yet been converted, and digital filter 114 has to wait for these bit sets.

Digital filter 114 of FIG. 1 generally has a filter latency requiring at least a predetermined number of bit sets (e.g., in the present example, four (4) bit sets) from the bit stream digitized from the input signal. In FIG. 2, if the predetermined number of bit sets is four, then the present invention takes advantage of the filter latency by having digital filter 114 wait for at least the predetermined number of bit sets (e.g., wait for at least four bit sets) to be available before the digital filter 114 converts and outputs the conversion word. In the example shown in FIG. 2, digital filter 114 waits for bit sets S1 to S4 to be available and then outputs conversion word instead of just converting bit set S1 and then outputting the conversion word based on one accurate bit set S1 and three prior bit sets S2 to S4 having inaccurate values. The implementation of the present invention in converting and outputting the conversion word based on the predetermined number of bit sets (e.g., four bit sets S1 to S4) is now discussed.

Figure 3:
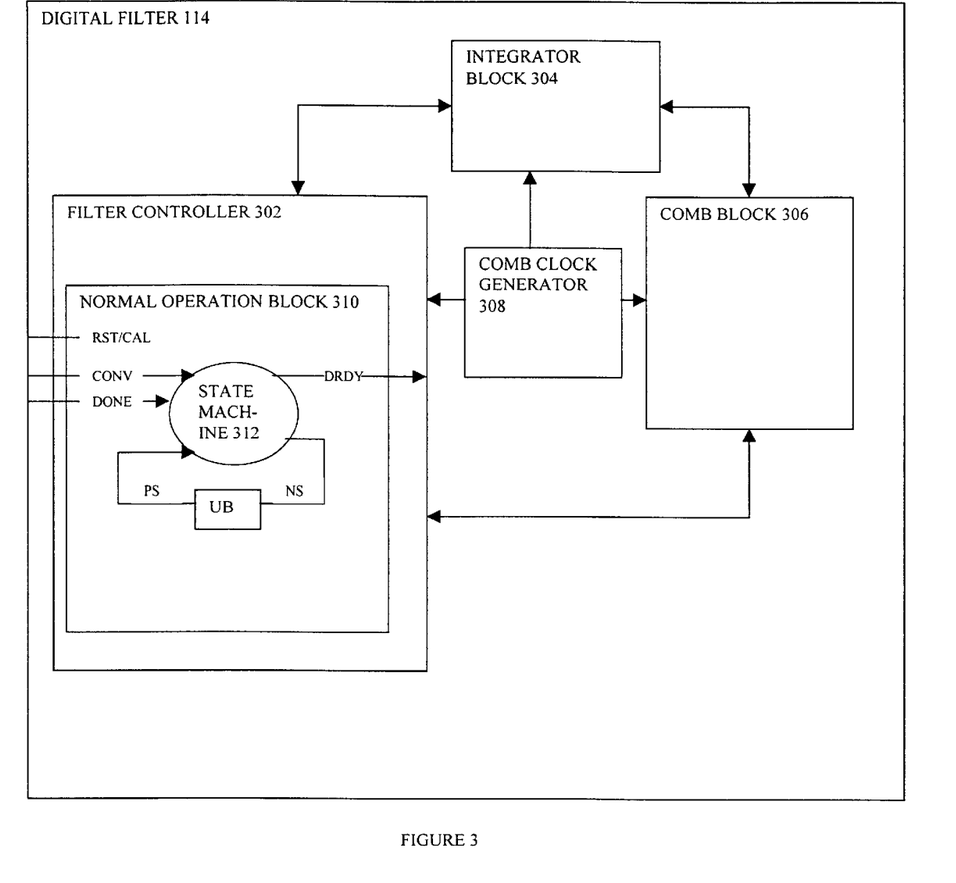
FIG. 3 is a digital filter for the ADC of FIG. 1 in which the digital filter has a filter controller with a state machine that implements the present invention.

With reference now to FIG. 3, a digital filter 114 for ADC 100 of FIG. 1 is shown. Digital filter 114 has a filter controller 302, an integrator block 304, a comb block 306, and a comb clock generator 308. Filter controller 302 controls filter operations of digital filter 114. Integrator block 304 is the first stage in the filter data path and accumulates the sample bits from the bit stream output from analog block 102. Comb block 306 is the second stage in the data path and performs a subtraction operation. Comb clock generator 308 provides the clock signal to integrator block 304 and comb block 306. Filter controller 302, integrator block 304, and comb block 306 are each coupled to comb clock generator 308 as shown in FIG. 3.

Filter controller 302 has a normal operation block 310 for controlling the normal operations of digital filter 114. Normal operation block 310 contains a state machine 312 for implementing the method and algorithm of the present invention. State machine 312 has a present state of operation, and state machine 312 generates a next state of operation. The present operational state is then updated with the generated next operational state. For example, in FIG. 3, state machine 312 has a present operational state that is represented and defined by a present state ("PS"). A next operational state of state machine 312 is defined by a next state ("NS"). When next state NS is copied into present state PS through update block ("UB"), the present operational state of state machine 312 then changes to and is updated with the next state values. The values of next state NS also change to define a further next operational state that state machine 312 will next enter.

FIG. 3 also shows the interfaces of various pins of ADC 100 within normal operation block 310 of filter controller 302. RST/CAL pin is coupled to normal operation block 310 for resetting serial port block 116 and digital filter 114 and performing an automatic calibration. CONV pin is coupled to state machine 312. The value of CONV pin is used by state machine 312 for starting a conversion of an analog input signal into a digital signal. Depending upon the type of convert start ("CS") signal (e.g., CS 204 or CS 206 of FIG. 2), state machine 312 directs filter controller 302, and thus digital filter 114, to operate in either the continuous conversion mode or the single conversion mode. Furthermore, state machine 312 receives a "DONE" signal from an internal counter in which the DONE signal signifies that all bits (e.g., all 96 bits) for a bit set has been converted and received from analog block 102 and filtered in the filter data path which includes integrator block 304, comb block 306, and comb clock generator 308. Also, state machine 312 outputs the value for DRDY pin, which signifies that the conversion data (e.g., conversion word(s)) is ready to be read by the user.

Figure 4:
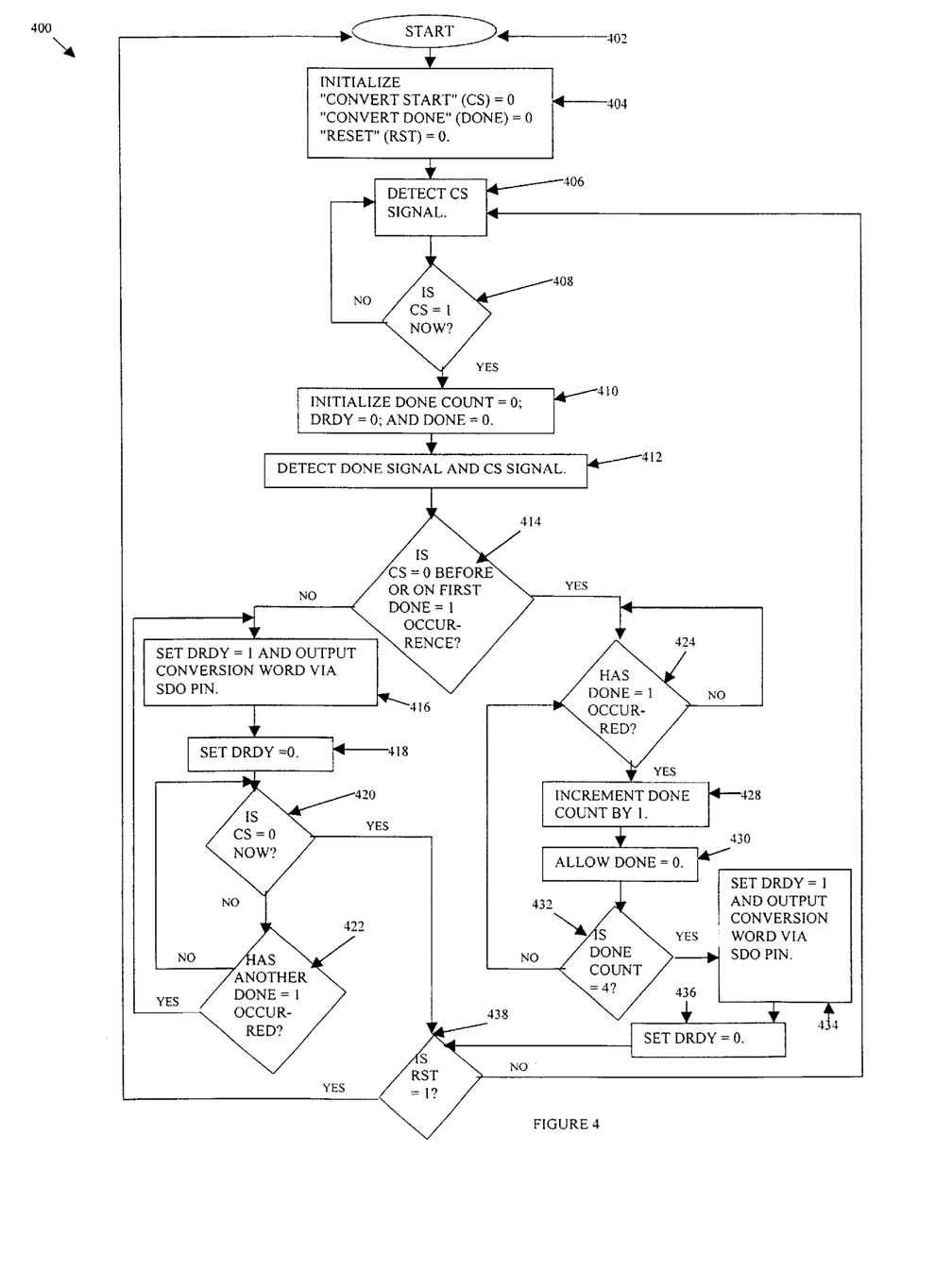
FIG. 4 is a flow chart of an exemplary state machine method for the state machine shown in FIG. 3 in accordance with the present invention.

Referring now to FIG. 4, a flow chart of an exemplary state machine method 400 for state machine 312 of FIG. 3 in accordance with the present invention is shown. State machine 312 has components coupled together in a manner to provide filter control operations. Any suitable components, devices, or sub-systems are used for state machine 312 to implement state machine method 400.

State machine method 400 starts at block 402. State machine method 400 proceeds to block 404, which shows the initialization of Convert Start ("CS") value, Convert Done ("DONE") value, and reset ("RESET") value to zero values. The CS value is the value according to the CS signal (e.g., CS 204 or CS 206 of FIG. 2) that is input into CONV pin as shown in FIGS. 1 and 3. The CS signal starts the conversion correspondingly in a continuous conversion mode or a single conversion mode. The DONE value is the value according to a DONE signal provided from an internal counter for state machine 312. The DONE signal is provided to the DONE pin as shown in FIG. 3. The DONE value is set to a one or high value pulse for signifying each time that a bit set has been converted. The RESET value is the value according to a reset signal input into RST/CAL pin as shown in FIGS. 1 and 3. A zero or low value for the RESET value maintains current operations of ADC 100, and a one or high value for the RESET value resets and performs automatic calibrations for restarting operations of ADC 100.

Following block 404, block 406 depicts state machine 312 detecting a convert start ("CS") signal (e.g., either a CS 204 or 206). State machine method 400 moves from block 406 to decision block 408, which illustrates state machine 312 determining whether the CS value is now equal to a one or high value based on the CS signal. If the CS value is not equal to a one or high value, then state machine method 400 loops back to block 406 and continues to detect the CS signal. However, if the CS value is now equal to a one or high value, then state machine 312 is signified to start a conversion process, and state machine method 400 moves onto block 410.

Block 410 shows that a done count ("DONE COUNT") value, a data ready ("DRDY") value, and the DONE value are all initialized to zero values. DONE COUNT value is an integer value that state machine 312 increments and/or resets to track the number of bit sets that have been converted. The DRDY value is the value set for DRDY pin, which is set to a one or high value to signify that the data is ready to be read by the user. The DONE value was discussed in detail earlier. Following block 410, block 412 depicts state machine 312 initiating and continuing detection of the CS signal for the CS value and the DONE signal for the DONE value.

State machine method 400 proceeds from block 412 to decision block 414. Decision block 414 illustrates state machine 312 determining whether the CS signal has a duration which ends on or before the first occurrence of a finished, converted sample bit set. State machine 312 accomplishes the determination by detecting whether the CS value changes back to the zero or low value before a first occurrence of when the DONE value equals a one or high value.

At decision block 414, if the CS value has not changed back to the zero or low value before the first occurrence of when the DONE value equals the one or high value, then state machine method 400 proceeds from decision block 414 to blocks 416 to 422, which depict state machine 312 selecting and implementing the continuous conversion mode. Block 416 shows state machine 312 setting the DRDY value to a one or high value. State machine 312 also outputs a conversion word via SDO pin. After the conversion word is read by the user as depicted in block 416, block 418 illustrates state machine 312 resetting DRDY value to the zero or low value.

State machine method 400 then moves from block 418 to decision block 420, which shows state machine 312 determining whether the CS value has changed back to the zero or low value. If the CS value has changed back to the zero or low value at decision block 420, then state machine method 400 proceeds directly to reset decision block 438 and continues therefrom. However, if at decision block 420 the CS value has not yet changed back to the zero or low value, then state machine 400 moves from decision block 420 to decision block 422. Decision block 422 illustrates state machine 312 determining whether at least another occurrence of when the DONE value equals the one or high value has occurred. If at least another occurrence of when the DONE value equals the one or high value has not occurred, then state machine method 400 loops back before decision block 420 and continues therefrom. State machine 312 then continues to detect whether the CS value has changed back to the zero or low value. On the other hand, if at decision block 422 at least another occurrence of when the DONE value equals the one or high value has occurred, then state machine method 400 loops back before block 416 and continues therefrom. Therefore, for each of the other occurrence(s) of when the DONE value equals the one or high value when the CS value has not yet changed back to the zero or low value, state machine 312 repeats the steps or filter control operations shown at block 416 and 418. Such steps or filter control operations include state machine 312 setting the DRDY value to the one or high value and outputting a conversion word. After another conversion word is read, state machine 312 then resets the DRDY value to the zero or value. State machine method 400 then continues onto decision blocks 420 and 422.

Referring back to decision block 414, if the CS value has changed back to the zero or low value before the first occurrence of when the DONE value equals the one or high value, then state machine method 400 proceeds from decision block 414 to blocks 424 to 436, which depict state machine 312 selecting and implementing the single conversion mode. The single conversion mode performs a single conversion of the input signal so that the digital system converts and outputs a fully-settled converted output. The present invention involves state machine 312 waiting for a predetermined number of (e.g., four (4)) conversion words if the CS signal has a duration which ends on or before the first occurrence of when the DONE value equals the one or high value. The last converted word is a fully-settled word. The predetermined number is not limited to any particular integer value, and any suitable integer value may be used for providing a fully-settled conversion word.

Decision block 424 shows state machine 312 determining whether an occurrence of when the DONE value equals the one or high value has occurred.

If an occurrence of when the DONE value equals the one or high value has not occurred, then state machine method 400 iterates at decision block 424 until the DONE value equals the one or high value occurs. After the DONE value equals the one or high value has occurred, state machine method 400 moves from decision block 424 to block 428. Block 428 illustrates state machine 312 incrementing the DONE COUNT value by an integer value of one. Following block 428, block 430 shows state machine 312 allowing the DONE value to go back to the zero value. State machine method 400 then moves from block 430 to decision block 432, which depicts state machine 312 determining whether the DONE COUNT value equals a predetermined number (e.g., equal to the predetermined number 4). The predetermined number represents an integer number of bit sets from a bit stream that are to be converted from an input signal before reading the fully-settled single converted output for the single conversion mode. In exemplary state machine method 400, the predetermined number is set to the integer value of four (4) since four bit sets are needed to be converted before a fully-settled conversion word as shown in FIG. 2 can be obtained.

If at decision block 432 the DONE COUNT value does not equal the predetermined number, then state machine method 400 loops back from decision block 432 to decision block 424 and repeats the steps or filter control operations in blocks 424 to 432 as shown in FIG. 4. The repeated steps or filter control operations include state machine 312 determining whether an occurrence of when the DONE value equals the one or high value has occurred, state machine 312 incrementing the DONE COUNT value by an integer one value and allowing the DONE value to go back to the zero or low value, and state machine 312 determining whether the DONE COUNT value equals the predetermined number (e.g. four (4)). If at decision block 432 the DONE COUNT value does equal the predetermined number, then state machine method 400 moves from decision block 432 to block 434. Block 434 shows state machine 312 setting the DRDY value equal to the one or high value when the conversion word is to be read by the user. The fully-settled conversion word is copied into serial port block 116, where the user may read it over the SDO pin by applying pulses to the SCLK pin. Following block 434, block 436 shows state machine 312 resetting the DRDY value equal to the zero or low value. State machine method 400 then proceeds from block 436 to reset decision block 438.

Decision block 438 illustrates state machine 312 determining whether the reset ("RST") value is equal to a one or high value. If the RST value is equal to the one or high value, state machine method 400 restarts execution of the method steps or filter control operations by looping back to start block 402. However, if the RST value is equal to a zero or low value, then state machine method 400 continues execution of the method steps or filter control operations by looping back to block 406 and continuing therefrom.

ADC 100 may be used in various applications such as analog-to-digital conversion in temperature sensing devices, weight determining devices, measuring instruments, audio applications, recording studio equipment, telecommunication systems and devices, and any other suitable applications.

The present invention discloses a method and system for selecting implementation of a filter controller between a single conversion that ensures a fully-settled converted output and a continuous conversion of an input signal. The present invention enables switching between the single conversion mode and the continuous conversion mode without the need of a separate pin on the ADC circuitry for switching between the conversion modes. The present invention also provides an ADC that ensures a fully-settled converted output when operating in the single conversion mode.

The present invention is not in any way limited to being implemented within any specific ADC, filter, filter controller, or state machine or by using any particular ADC component, device, or sub-system, and the present invention may be implemented within any suitable system and/or by using any suitable component, device, or system.

While the invention has been particularly shown and described with reference to a preferred embodiment, it will be understood by those skilled in the art that various changes in form and detail may be made therein without departing from the spirit and scope of the invention.

What is claimed is:

1. A method for selecting by a state machine implementation of a filter controller for an analog-to-digital converter having a digital system and an analog system between a single conversion and a continuous conversion of an input signal, comprising the steps of:

detecting, by the state machine, a convert start signal which signifies a start of a conversion process;

determining, by the state machine, whether the convert start signal has a duration which ends on or before a first occurrence of a conversion done on the input signal wherein the conversion done is an occurrence of when a bit set has been converted from the input signal;

in response to the convert start signal having the duration which ends on or before the first occurrence of the conversion done, selecting and implementing, by the state machine, the single conversion of the input signal so that the digital system ensures a fully-settled converted output; and otherwise, selecting and implementing, by the state machine, the continuous conversion of the input signal.

2. The method according to claim 1, wherein selecting and implementing, by the state machine, the single conversion of the input signal further comprises:

in response to the convert start signal having the duration which ends on or before the first occurrence of the conversion done, waiting, by the state machine of the filter controller, for a predetermined number of bit sets to be converted from the input signal; and utilizing, by the filter controller, the predetermined number of bit sets to provide and output the fully-settled converted output.

3. The method according to claim 2 wherein the predetermined number is four.

4. The method according to claim 1, wherein detecting, by the state machine, a convert start signal further comprises:

initializing, by the state machine, a convert start value equal to a zero value;

maintaining, by the state machine, the convert start value according to values of the convert start signal; and determining, by the state machine, whether the convert start value has changed from the initial zero value to a one value in signifying the start of the conversion process.

5. The method according to claim 4, wherein determining, by the state machine, whether the convert start signal has a duration which ends on or before a first occurrence of a conversion done on the input signal further comprises:

initializing, by the state machine, a done count value equal to a zero value wherein the done count value tracks a predetermined number of bit sets converted from the input signal wherein the predetermined number of bit sets defines the fully-settled converted output;

initializing, by the state machine, a done value equal to a zero value wherein the done value is made equal to values according to a done signal having pulse signals that equal a one value only at each of the occurrences of when the bit sets are converted from the input signal;

maintaining, by the state machine, the done value according to the values of the done signal; and after the convert start value has changed from the initial zero value to the one value, determining, by the state machine, whether the convert start value changes back to the zero value before a first occurrence of when the done value equals a one value.

6. The method according to claim 5, wherein selecting and implementing, by the state machine, the continuous conversion of the input signal further comprises:

initializing, by the state machine, a data ready value to a zero value wherein the data ready value equals a one value to indicate when the fully-settled converted output is ready in a filter to be read by a user;

in response to the convert start value not changing back to the zero value before the first occurrence of when the done value equals the one value, setting, by the state machine, the data ready value to a one value, transferring the fully-settled converted output to a serial port, and after the fully-settled converted output is read from the serial port, resetting, by the state machine, the data ready value to the zero value;

determining, by the state machine, whether the convert start value has changed back to the zero value;

in response to the convert start value having not yet changed back to the zero value, determining, by the state machine, whether at least another occurrence of when the done value equals the one value has occurred; and in response to each of the at least another occurrence of when the done value equals the one value occurring during a time period when the convert start value has not yet changed back to the zero value, repeating the steps of setting, by the state machine, the data ready value to the one value, transferring, by the state machine, the fully-settled converted output to the serial port, and after the fully-settled converted output is read from the serial port, resetting, by the state machine, the data ready value to the zero value.

7. The method according to claim 5, wherein selecting and implementing, by the state machine, the single conversion of the input signal further comprises:

initializing, by the state machine, a data ready value to a zero value wherein the data ready value equals a onevalue to indicate when the fully-settled converted output is ready in a filter to be read by a user;

in response to the convert start value changing back to the zero value before the first occurrence of when the done value equals the one value, determining, by the state machine, whether an occurrence of when the done value equals the one value has occurred;

in response to the occurrence of when the done value equals the one value occurring, incrementing, by the state machine, the done count value by a onevalue and allowing the done value to go back to the zero value;

determining, by the state machine, whether the done count value equals a predetermined number that represents a number of bit sets of the input signal that are to be converted before outputting the fully-settled converted output for the single conversion;

in response to the done count value not equaling the predetermined number, repeating the steps of determining, by the state machine, whether an occurrence of when the done value equals the one value has occurred, incrementing, by the state machine, the done count value by a onevalue and allowing the done value to go back to the zero value, and determining, by the state machine, whether the done count value equals the predetermined number; and in response to the done count value equaling the predetermined number, setting, by the state machine, the data ready value equal to the one value, transferring, by the state machine, the fully-settled converted output to a serial port, and after the fully-settled converted output is read from the serial port, resetting, by the state machine, the data ready value equal to the zero value.

8. The method according to claim 1 further comprising the steps of:

initializing, by the state machine, a reset value equal to a zero value wherein the reset value equals a one value to signify when the method is to be restarted; and in response to the reset value being equal to the one value, restarting, by the state machine, execution of the method steps.

9. A filter controller for an analog-to-digital converter having a digital system and an analog system wherein the filter controller selects an operation between a single conversion and a continuous conversion of an input signal, comprising:

a state machine having components coupled together in a manner to provide filter control operations which include:

the state machine detecting a convert start signal which signifies a start of a conversion process;

the state machine determining whether the convert start signal has a duration which ends on or before a first occurrence of a conversion done on the input signal wherein the conversion done is an occurrence of when a bit set has been converted from the input signal;

in response to the convert start signal having the duration which ends on or before the first occurrence of the conversion done, the state machine selecting and implementing the single conversion of the input signal so that the digital system converts and outputs a fully-settled converted output; and otherwise, the state machine selecting and implementing the continuous conversion of the input signal.

10. The filter controller according to claim 9, wherein the components provide the filter control operations that further comprise:

in response to the convert start signal having the duration which ends on or before the first occurrence of the conversion done, the state machine of the filter controller waiting for a predetermined number of bit sets to be converted from the input signal; and the state machine utilizing the predetermined number of bit sets to provide and output the fully-settled converted output.

11. The filter controller according to claim 10 wherein the predetermined number is four.

12. The filter controller according to claim 9, wherein the components provide the filter control operations that further comprise:

the state machine initializing a convert start value equal to a zero value;

the state machine maintaining the convert start value according to values of the convert start signal; and the state machine determining whether the convert start value has changed from the initial zero value to a one value in signifying the start of the conversion process.

13. The filter controller according to claim 12, wherein the components provide the filter control operations that further comprise:

the state machine initializing a done count value equal to a zero value wherein the done count tracks a predetermined number of bit sets converted from the input signal wherein the predetermined number of bit sets defines the fully-settled converted output;

the state machine initializing a done value equal to a zero value wherein the done value is made equal to values according to a done signal having pulse signals that equal a one value only at each of the occurrences of when the bit sets are converted from the input signal;

the state machine maintaining the done value according to the values of the done signal; and after the convert start value has changed from the initial zero value to the one value, the state machine determining whether the convert start value changes back to the zero value before a first occurrence of when the done value equals a one value.

14. The filter controller according to claim 13, wherein the components provide the filter control operations that further comprise:

the state machine initializing a data ready value to a zero value wherein the data ready value equals a one value to indicate when the fully-settled converted output is ready in a filter to be read by a user;

in response to the convert start value not changing back to the zero value before the first occurrence of when the done value equals the one value, the state machine setting the data ready value to a one value, the state machine transferring the fully-settled converted output to a serial port, and after the fully-settled converted output is read from the serial port, the state machine resetting the data ready value to the zero value;

the state machine determining whether the convert start value has changed back to the zero value;

in response to the convert start value having not yet changed back to the zero value, the state machine determining whether at least another occurrence of when the done value equals the one value has occurred; and in response to each of the at least another occurrence of when the done value equals the one value occurring during a time period when the convert start value has not yet changed back to the zero value, the state machine repeating the filter control operations of the state machine setting the data ready value to the one value, the state machine transferring the fully-settled converted output to the serial port, and after the fully-settled converted output is read from the serial port, the state machine resetting the data ready value to the zero value.

15. The filter controller according to claim 13, wherein the components provide the filter control operations that further comprise:

the state machine initializing a data ready value to a zero value wherein the data ready value equals a one value to indicate when the fully-settled converted output is ready in a filter to be read by a user;

in response to the convert start value changing back to the zero value before the first occurrence of when the done value equals the one value, the state machine determining whether an occurrence of when the done value equals the one value has occurred;

in response to the occurrence of when the done value equals the one value occurring, the state machine incrementing the done count value by a one value and allowing the done value to go back to the zero value;

the state machine determining whether the done count value equals a predetermined number that represents a number of bit sets of the input signal that are to be converted before outputting the fully-settled converted output for the single conversion;

in response to the done count value not equaling the predetermined number, the state machine repeating the filter control operations of the state machine determining whether an occurrence of when the done value equals the one value has occurred, the state machine incrementing the done count value by a one value and allowing the done value to go back to the zero value, and the state machine determining whether the done count value equals the predetermined number; and in response to the done count value equaling the predetermined number, the state machine setting the data ready value equal to the one value, the state machine transferring the fully-settled converted output to a serial port, and after the fully-settled converted output is read from the serial port, the state machine resetting the data ready value equal to the zero value.

16. The filter controller according to claim 9, wherein the components provide the filter control operations that further comprise:

the state machine initializing a reset value equal to a zero value wherein the reset value equals a one value to signify when the filter control operations are to be restarted; and in response to the reset value being equal to the one value, the state machine restarting execution of the filter control operations.

17. An analog-to-digital converter for converting analog signals to digital signals, comprising an analog system having a modulator for processing and converting analog signals to digital signals; and a digital system coupled to the analog system wherein the digital system processes and outputs the digital signals;

wherein the digital system has a filter with an integrating system, a comb system, a comb clock generator, and a filter controller coupled to each other;

wherein the filter controller selects an operation between a single conversion and a continuous conversion of an input signal and wherein the filter controller comprises a state machine having components coupled together in a manner to provide filter control operations which include:

the state machine detecting a convert start signal which signifies a start of a conversion process;

the state machine determining whether the convert start signal has a duration which ends on or before a first occurrence of a conversion done on the input signal wherein the conversion done is an occurrence of when a bit set has been converted from the input signal;

in response to the convert start signal having the duration which ends on or before the first occurrence of the conversion done, the state machine selecting and implementing the single conversion of the input signal so that the digital system converts and outputs a fully-settled converted output; and otherwise, the state machine selecting and implementing the continuous conversion of the input signal.

18. The analog-to-digital converter according to claim 17, wherein the components provide the filter control operations that further comprise:

in response to the convert start signal having the duration which ends on or before the first occurrence of the conversion done, the state machine of the filter controller waiting for a predetermined number of bit sets to be converted from the input signal; and the state machine utilizing the predetermined number of bit sets to provide and output the fully-settled converted output.

19. The analog-to-digital converter according to claim 18 wherein the predetermined number is four.

20. The analog-to-digital converter according to claim 17, wherein the components provide the filter control operations that further comprise:

the state machine initializing a convert start value equal to a zero value;

the state machine maintaining the convert start value according to values of the convert start signal; and the state machine determining whether the convert start value has changed from the initial zero value to a one value in signifying the start of the conversion process.

21. The analog-to-digital converter according to claim 20, wherein the components provide the filter control operations that further comprise:

the state machine initializing a done count value equal to a zero value wherein the done count tracks a predetermined number of bit sets converted from the input signal wherein the predetermined number of bit sets defines the fully-settled converted output;

the state machine initializing a done value equal to a zero value wherein the done value is made equal to values according to a done signal having pulse signals that equal a one value only at each of the occurrences of when the bit sets are converted from the input signal;

the state machine maintaining the done value according to the values of the done signal; and after the convert start value has changed from the initial zero value to the one value, the state machine determining whether the convert start value changes back to the zero value before a first occurrence of when the done value equals a one value.

22. The analog-to-digital converter according to claim 21, wherein the components provide the filter control operations that further comprise:

the state machine initializing a data ready value to a zero value wherein the data ready value equals a one value to indicate when the fully-settled converted output is ready in a filter to be read by a user;

in response to the convert start value not changing back to the zero value before the first occurrence of when the done value equals the one value, the state machine setting the data ready value to a one value, the state machine transferring the fully-settled converted output to a serial port, and after the fully-settled converted output is read from the serial port, the state machine resetting the data ready value to the zero value;

the state machine determining whether the convert start value has changed back to the zero value;

in response to the convert start value having not yet changed back to the zero value, the state machine determining whether at least another occurrence of when the done value equals the one value has occurred; and in response to each of the at least another occurrence of when the done value equals the one value occurring during a time period when the convert start value has not yet changed back to the zero value, the state machine repeating the filter control operations of the state machine setting the data ready value to the one value, the state machine transferring the fully-settled converted output to the serial port, and after the fully-settled converted output is read from the serial port, the state machine resetting the data ready value to the zero value.

23. The analog-to-digital converter according to claim 21, wherein the components provide the filter control operations that further comprise:

the state machine initializing a data ready value to a zero value wherein the data ready value equals a one value to indicate when the fully-settled converted output is ready in a filter to be read by a user;

in response to the convert start value changing back to the zero value before the first occurrence of when the done value equals the one value, the state machine determining whether an occurrence of when the done value equals the one value has occurred;

in response to the occurrence of when the done value equals the one value occurring, the state machine incrementing the done count value by a one value and allowing the done value to go back to the zero value;

the state machine determining whether the done count value equals a predetermined number that represents a number of bit sets of the input signal that are to be converted before outputting the fully-settled converted output for the single conversion;

in response to the done count value not equaling the predetermined number, the state machine repeating the filter control operations of the state machine determining whether an occurrence of when the done value equals the one value has occurred, the state machine incrementing the done count value by a one value and allowing the done value to go back to the zero value, and the state machine determining whether the done count value equals the predetermined number; and in response to the done count value equaling the predetermined number, the state machine setting the data ready value equal to the one value, the state machine transferring the fully-settled converted output to a serial port, and after the fully-settled converted output is read from the serial port, the state machine resetting the data ready value equal to the zero value.

24. The analog-to-digital converter according to claim 17, wherein the components provide the filter control operations that further comprise:

the state machine initializing a reset value equal to a zero value wherein the reset value equals a one value to signify when the filter control operations are to be restarted; and in response to the reset value being equal to the one value, the state machine restarting execution of the filter control operations.

25. A method of selecting between operating an analog-to-digital converter ("ADC") in a single conversion mode and a continuous conversion mode, comprising the steps of:

in response to a convert start signal for the ADC having a duration which ends on or before a first occurrence of a conversion done signifying a bit set of an input signal of the ADC has been converted, operating the ADC in a single conversion mode; and otherwise, operating the ADC in a continuous conversion mode.

26. The method according to claim 25, wherein a convert start value is initialized to a zero value and follows values of the convert start signal and a done value is initialized to a zero value and follows values of a done signal having pulse signals that equal a one value only at each occurrence of the conversion done signifying the bit set of the input signal having been converted, and wherein the step of operating the ADC in a single conversion mode further comprises the step of:

after the convert start value has changed from the initial zero value to a one value, operating the ADC in the single conversion mode if the convert start value changes back to the zero value before a first occurrence of when the done value equals a one value.

* * * * *